(12) United States Patent
Park et al.

(10) Patent No.: US 11,204,058 B2
(45) Date of Patent: Dec. 21, 2021

(54) SCREW ANTI-LOOSENING STRUCTURE AND AN ELECTRONIC DEVICE HAVING THE SAME

(71) Applicant: SAMSUNG ELECTRONICS CO., LTD., Suwon-si (KR)

(72) Inventors: Sunhong Park, Sejong-si (KR); Hyunjong Oh, Seoul (KR); Jaechan Lee, Asan-si (KR); Doyoung Jung, Asan-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/822,182

(22) Filed: Mar. 18, 2020

(65) Prior Publication Data

US 2021/0048060 A1 Feb. 18, 2021

(30) Foreign Application Priority Data

Aug. 16, 2019 (KR) .................. 10-2019-0100054

(51) Int. Cl.
*H05K 5/00* (2006.01)
*F16B 39/282* (2006.01)

(52) U.S. Cl.
CPC ......... *F16B 39/282* (2013.01); *H05K 5/0008* (2013.01); *H05K 5/0052* (2013.01)

(58) Field of Classification Search
USPC ........................................ 361/759
See application file for complete search history.

(56) References Cited

U.S. PATENT DOCUMENTS

| 3,133,580 | A | * | 5/1964 | Katz | F16B 39/24 |
| | | | | | 411/134 |
| 3,926,237 | A | * | 12/1975 | Enders | F16B 39/282 |
| | | | | | 411/135 |
| 7,497,652 | B2 | | 3/2009 | Lin | |
| 8,425,169 | B2 | | 4/2013 | Burtsche et al. | |
| 9,022,709 | B2 | | 5/2015 | Benzing | |
| 9,168,075 | B2 | * | 10/2015 | Dell'Oca | A61B 17/8057 |
| 9,504,160 | B2 | * | 11/2016 | Oh | H01R 12/7082 |
| 9,574,599 | B2 | | 2/2017 | Marc | |
| 9,732,783 | B2 | | 8/2017 | Lee et al. | |
| 2016/0290384 | A1 | * | 10/2016 | Michiwaki | F16B 39/24 |
| 2018/0223889 | A1 | | 8/2018 | Yi et al. | |
| 2018/0368894 | A1 | | 12/2018 | Wieland et al. | |
| 2018/0368951 | A1 | | 12/2018 | Lee et al. | |
| 2019/0063484 | A1 | | 2/2019 | Zou | |
| 2019/0074607 | A1 | | 3/2019 | Ruland | |

FOREIGN PATENT DOCUMENTS

KR 10-2014-0124595 10/2014

* cited by examiner

*Primary Examiner* — Hung S. Bui
(74) *Attorney, Agent, or Firm* — F. Chau & Associates, LLC

(57) ABSTRACT

A screw anti-loosening structure is provided including a screw disposed within a screw hole. The screw hole is disposed within a first casing. A screw groove is disposed within a second casing. At least one stub protrudes toward the screw hole of the first casing. The screw anti-loosening structure further includes at least one stub groove disposed within a side surface of a head of the screw. The at least one stub is disposed within the stub groove.

20 Claims, 13 Drawing Sheets

SCREW ANTI-LOOSENING STRUCTURE AND AN ELECTRONIC DEVICE HAVING THE SAME

CROSS-REFERENCE TO RELATED APPLICATION

This U.S. non-provisional patent application claims priority under 35 U.S.C. § 119 to Korean Patent Application No. 10-2019-0100054, filed on Aug. 16, 2019 in the Korean Intellectual Property Office (KIPO), the disclosure of which is incorporated by reference herein in its entirety.

1. Technical Field

Exemplary embodiments of the disclosure provide screw anti-loosening structures and an electronic device having the same.

2. Discussion of the Related Art

Casings for an electronic device may include an upper and a lower casing that are fastened by screws. The screws for fastening the casings may become worn over time due to external impacts or vibrations. Also, the screws may be loosened by vibration or external impacts and may become separated from the casings. When the screws are loosened, a fastening force between an upper casing and a lower casing is reduced. Thus, the upper casing and the lower casing will become separated. A separate element may be provided for preventing the upper casing from being detached from the lower casing in the electronic device, causing an increase in the manufacturing cost.

SUMMARY

Exemplary embodiments of the present inventive concept provide for screw anti-loosening structures and electronic devices having the screw anti-loosening structures.

According to an exemplary embodiment of the present inventive concept, a screw anti-loosening structure is provided including a screw disposed within a screw hole. The screw hole is disposed within a first casing. A screw groove is disposed within a second casing. At least one stub protrudes toward the screw hole of the first casing. The screw anti-loosening structure further includes at least one stub groove disposed within a side surface of a head of the screw. The at least one stub is disposed within the stub groove.

According to an exemplary embodiment of the present inventive concept, a screw anti-loosening structure is provided including a screw disposed within a screw hole. The screw hole is disposed within a first casing. A screw groove is disposed within a second casing. A stub tie is disposed within the screw hole. The stub tie including a plurality of stubs protruding toward the screw hole. The screw anti-loosening structure further includes a plurality of stub grooves disposed within a side surface of a head of the screw. The plurality of stubs is disposed within the plurality of stub grooves.

According to an exemplary embodiment of the present inventive concept, an electronic device is provided including a screw anti-loosening structure for fastening casings. The electronic device includes a first casing and a second casing. A space is provided between the first casing and the second casing. The screw anti-loosening structure is provided for fastening the first casing to the second casing. A printed circuit board includes a plurality of semiconductor chips disposed in the space provided between the first casing and the second casing. The screw anti-loosening structure includes a screw disposed within a screw hole. The screw hole is disposed within the first casing. A screw groove is disposed within the second casing. A plurality of stubs protrudes toward the screw hole of the first casing. A plurality of stub grooves is disposed within a side surface of a head of the screw. The plurality of stubs is disposed within the plurality of stub grooves. The plurality of stubs protrudes from an inner sidewall of the first casing.

BRIEF DESCRIPTION OF THE DRAWINGS

Exemplary embodiments of the present inventive concept will be more clearly understood from the following detailed description taken in conjunction with the accompanying drawings in which.

DETAILED DESCRIPTION OF THE EMBODIMENTS

Figure 1:
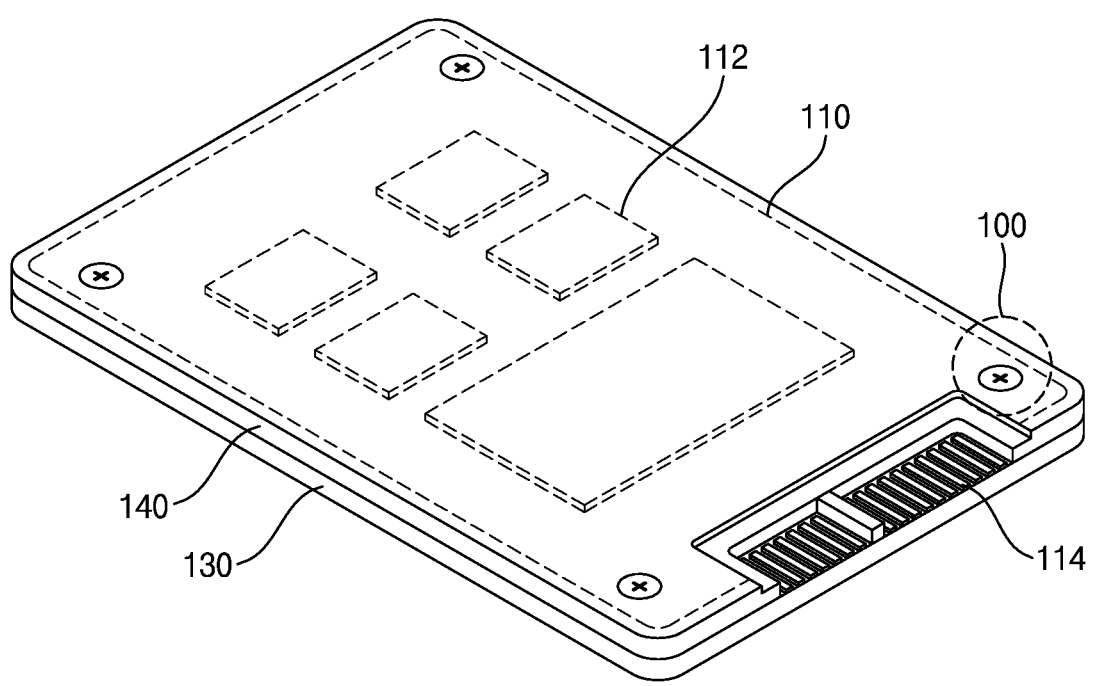
FIG. 1 is a perspective view illustrating an electronic device including a screw anti-loosening structure in accordance with an exemplary embodiment of the present inventive concept.
Figure 2A:
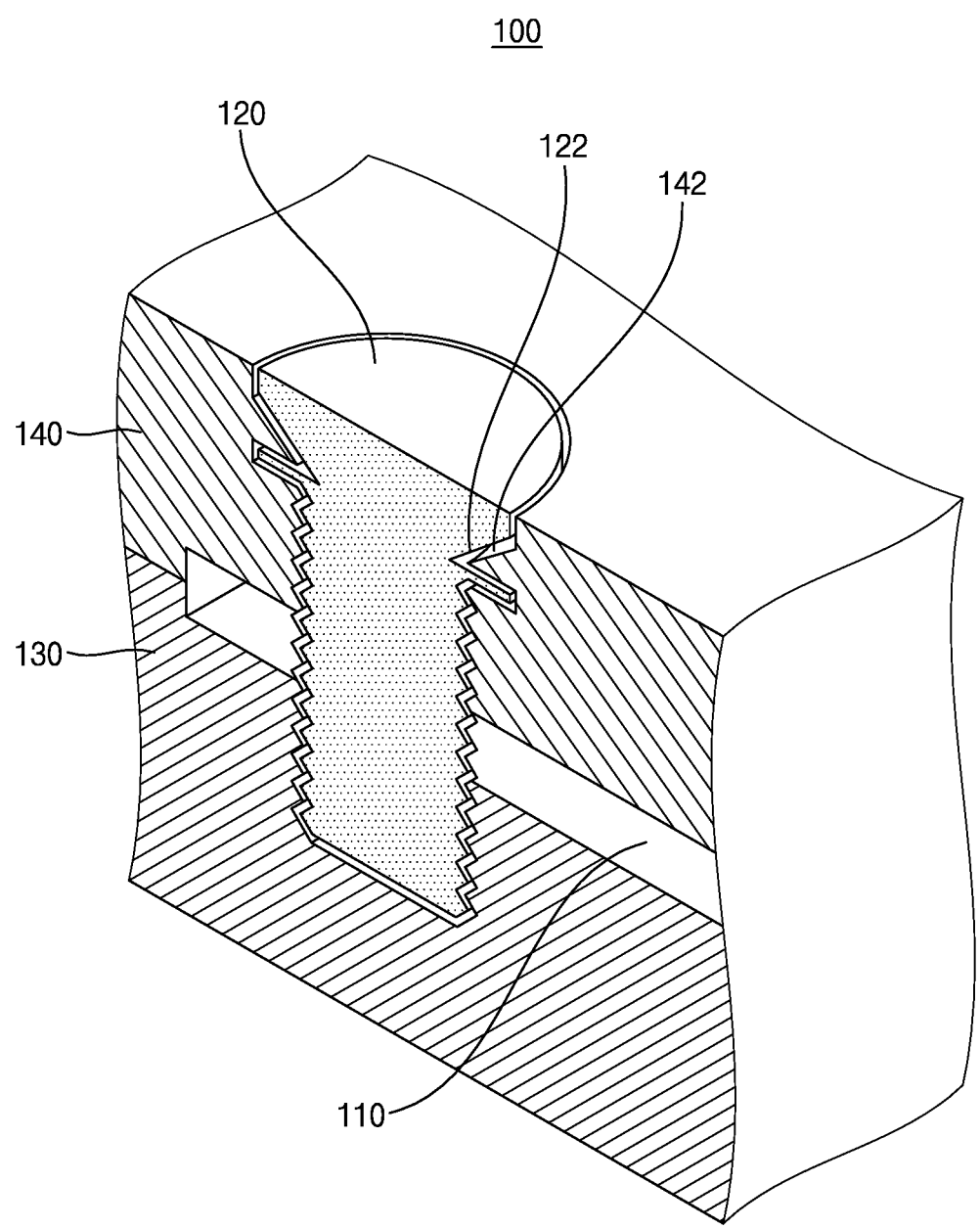
FIG. 2A is a perspective view illustrating a cross-section of a screw anti-loosening structure in accordance with an exemplary embodiment of the present inventive concept.
Figure 2B:
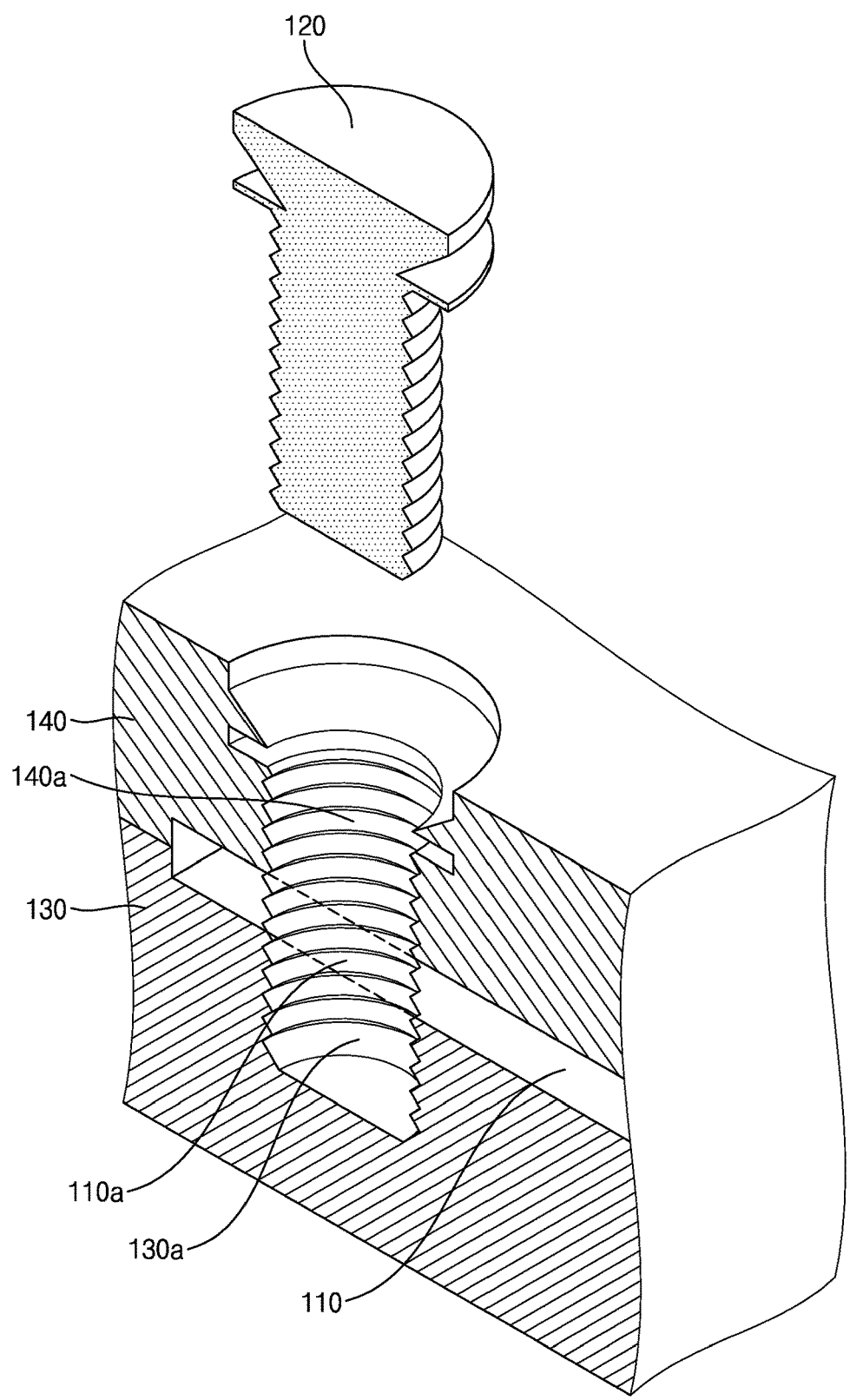
FIG. 2B is an exploded perspective view illustrating a cross-section in which a screw is not inserted into an upper casing and a lower casing of a screw anti-loosening structure.

FIG. 1 is a perspective view illustrating an electronic device 10 including a screw anti-loosening structure 100 in accordance with an embodiment. FIG. 2A is a perspective view illustrating a cross-section of a screw anti-loosening structure 100 in accordance with an exemplary embodiment of the present inventive concept. FIG. 2B is an exploded perspective view illustrating a cross-section in which a screw 120 is not inserted into a lower casing 130 and an upper casing 140.

Referring to FIGS. 1, 2A, and 2B, the electronic device 10 may include a printed circuit board (PCB) 110 including a plurality of semiconductor chips 112 and input/output (I/O) terminals 114, a plurality of casings 130 and 140, and a plurality of screw structures 100.

In order to protect the semiconductor chips 112 and the PCB 110 from heat, moisture, vibrations, and impacts from the outside, the PCB 110 including the semiconductor chips 112 may be disposed between the casings 130 and 140.

The casings 130 and 140 may include an upper casing (also referred to herein as a first casing) 140 and a lower casing (also referred to herein as a second casing) 130. The plurality of screw structures 100 may be applied for fastening the upper casing 140 to the lower casing 130. A plurality of screw holes 140a into which a plurality of screws 120 are respectively inserted may be provided in the upper casing 140. The plurality of screw holes 140a may be provided in edge portions of the upper casing 140. However, the present inventive concept is not limited thereto. A plurality of screw grooves 130a into which the plurality of screws 120 are respectively inserted may be provided in the lower casing 130. The plurality of screw grooves 130a may be provided in edge portions of the lower casing 130.

The plurality of screw holes 140a and the plurality of screw grooves 130a may overlap in a vertical direction (e.g., an axis normal to an upper surface of the electronic device 10, also referred to herein as a thickness direction). In order for the screws 120 to be fastened to the plurality of screw holes 140a and the plurality of screw grooves 130a, screw crests and screw roots may be provided in each of the plurality of screw holes 140a and the plurality of screw grooves 130a. The screws 120 may be inserted into the plurality of screw holes 140a and the plurality of screw grooves 130a, and thus, the lower casing 130 and the upper casing 140 may be coupled. The screws 120 may be inserted in a first direction from the upper casing 140 to the lower casing 130 and may fasten the upper casing 140 to the lower casing 130.

A plurality of holes 110a into which the screws 120 are inserted may be provided in edge portions of the PCB 110, and the screws 120 may be inserted into the holes 110a of the PCB 110. By using the screws 120, the lower casing 130 may be fastened to the upper casing 140, and the PCB 110 may be fixed to the inner portion between the lower casing 130 and the upper casing 140.

The present exemplary embodiment of the present inventive concept is not limited thereto, and the screws 120 may be inserted in a second direction from the lower casing 130 to the upper casing 140 and may fasten the upper casing 140 to the lower casing 130. In a casing where the screws 120 are inserted in the second direction from the lower casing 130 to the upper casing 140, a plurality of holes may be provided in the lower casing 130, and a plurality of grooves may be provided in the upper casing 140.

The screw anti-loosening structure 100 in accordance with an exemplary embodiment of the present inventive concept may be applied for fastening the upper casing 140 to the lower casing 130 in the electronic device 10 (for example, a solid state drive (SSD)).

The screw anti-loosening structure 100 may include a plurality of stubs 142 and screws 120. Hereinafter, one screw 120 and one stub 142 will be described for convenience of description.

The holes 140a passing through the upper casing 140 may include inner sidewalls. The inner sidewalls may have a shape substantially corresponding to a shape of the screws 120. The stub 142 may protrude from at least one inner sidewall of the upper casing 140. The stub 142 may have a protruding tetrahedral shape, but is not limited thereto and may have, for example, a protruding polyhedral shape. One screw anti-loosening structure 100 may include two to four stubs 142, but is not limited thereto and may include five to eight stubs 142. The stub 142 may include an elastic resin material, but is not limited thereto and may include, for example, a nylon material.

Figure 3:
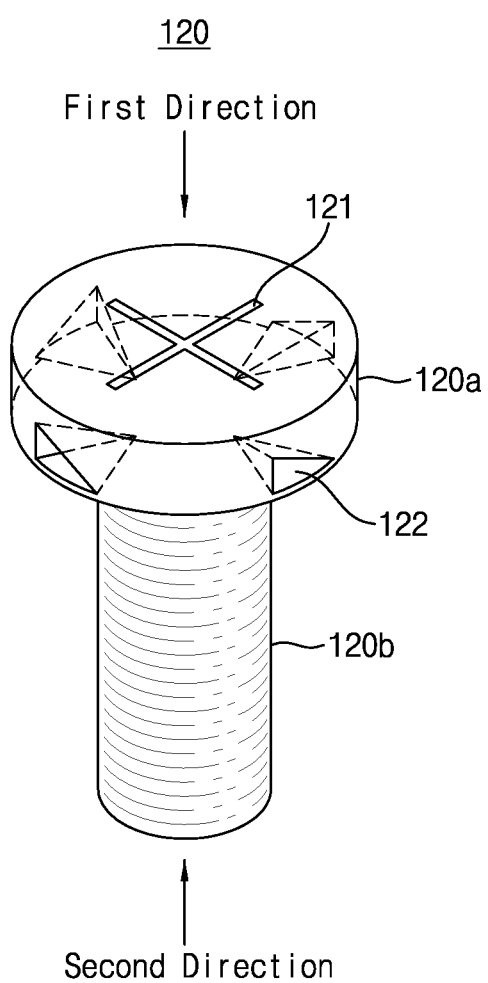
FIG. 3 is a perspective view illustrating a screw used in the screw anti-loosening structure in accordance with an exemplary embodiment of the present inventive concept.
Figure 4:
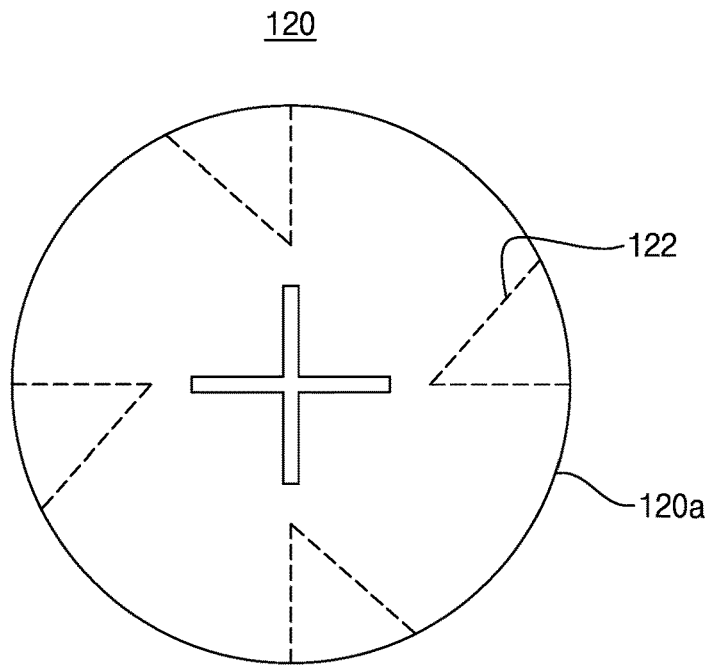
FIG. 4 is a plan view illustrating a top of the screw shown in FIG. 3.
Figure 5:
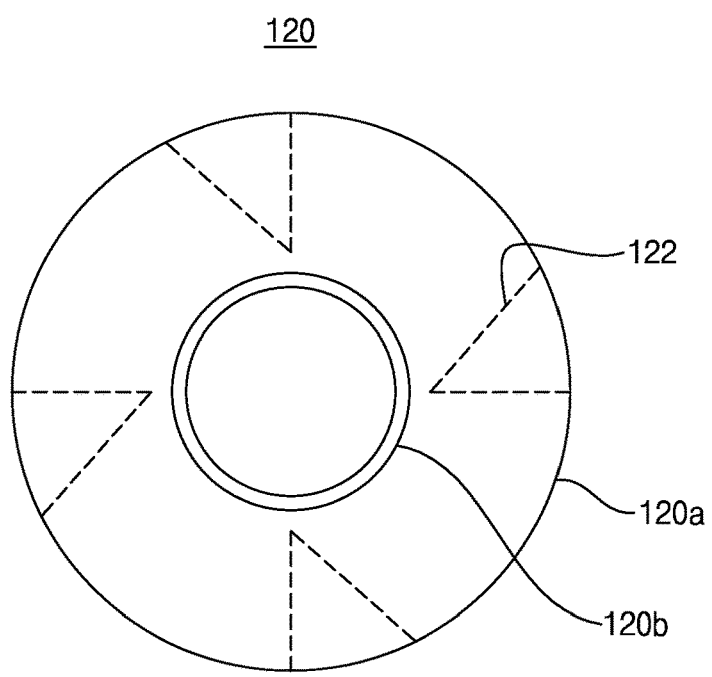
FIG. 5 is a plan view illustrating a bottom of the screw shown in FIG. 3.

FIG. 3 illustrates a screw 120 in accordance with an exemplary embodiment of the present inventive concept. FIG. 4 is a plan view illustrating the top of screw 120 illustrated in FIG. 3 (i.e., viewed from the first direction) according to an exemplary embodiment of the present inventive concept. FIG. 5 is a plan view illustrating a bottom of the screw 120 shown in FIG. 3 (i.e., viewed from the second direction) according to an exemplary embodiment of the present inventive concept. The first direction and the second direction may be diametrically opposed.

Referring to FIGS. 3 to 5, the screw 120 may include a head 120a and a body 120b. A cross type groove 121 which enables the screw 120 to be tightened or loosened may be provided in an upper surface of the head 120a of the screw 120. A diameter of the head 120a of the screw 120 may be about 2.0 mm to about 5.0 mm. A plurality of stub grooves 122 into which the plurality of stubs 142 (shown in FIG. 6) are inserted may be provided in a side surface of the head 120a of the screw 120. For example, the stub grooves 122 may have a substantially complementary shape to a shape of the plurality of stubs 142.

Figure 6:
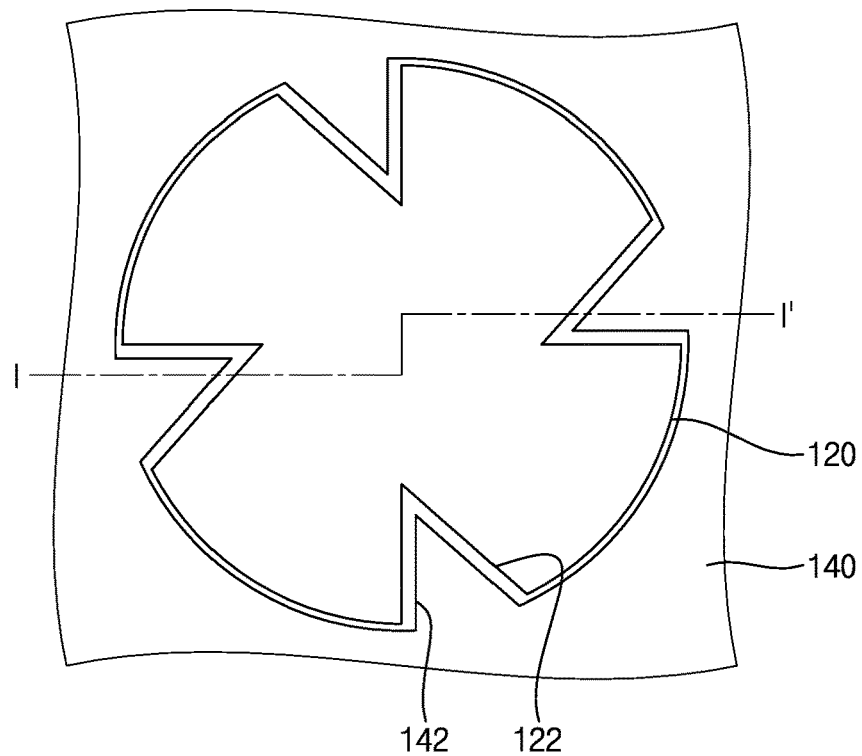
FIG. 6 is a bottom view illustrating a screw anti-loosening structure in accordance with an exemplary embodiment of the present inventive concept.
Figure 7:
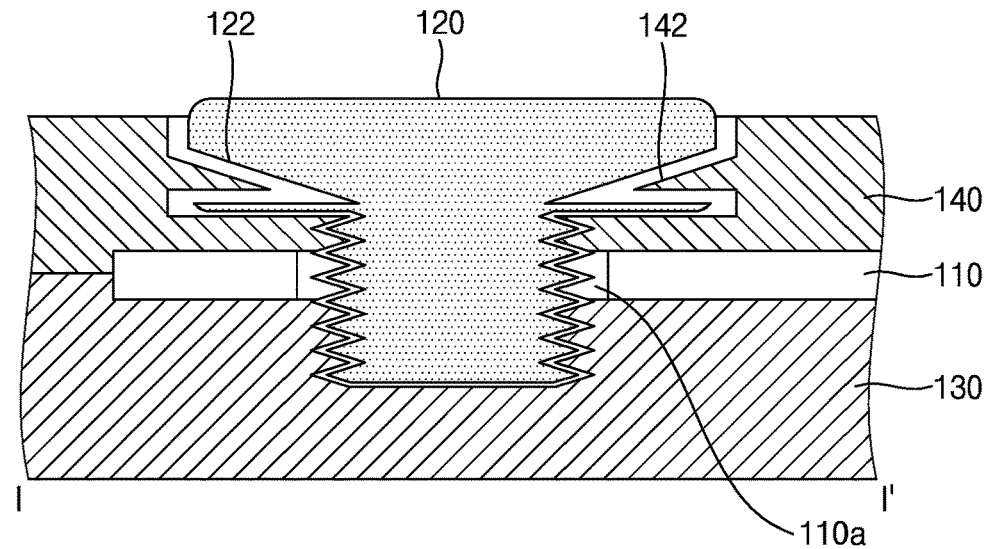
FIG. 7 is a side-view illustrating a cross-section taken along line I-I' shown in FIG. 6.

FIG. 6 is a plan view illustrating a bottom of a screw anti-loosening structure 100 in accordance with an exemplary embodiment of the present inventive concept. FIG. 7 is a side view illustrating a cross-section taken along line I-I' shown in FIG. 6.

Referring to FIGS. 6 and 7, when the screw 120 rotates in the forward direction (e.g., a clockwise direction), the stub 142 may be inserted into the stub groove 122 provided in the side surface of the head 120a. Each of the stub grooves 122 may be provided to be wider than each of the stubs 142. For example, the stubs 142 might not directly contact sidewalls of the stub grooves 122, when viewed in a plan view.

In a casing where each of the stubs 142 has a protruding tetrahedral shape, each of the stub grooves 122 may have a recessed tetrahedral shape (or a concave tetrahedral shape), but the present inventive concept is not limited thereto. In an exemplary embodiments of the present inventive concept, in a casing where each of the stubs 142 has a protruding polyhedral shape, each of the stub grooves 122 may have a recessed polyhedral shape (or a concave polyhedral shape) to complement a corresponding stub 142. The body 120b of the screw 120 may have a rod shape, and screw crests and screw roots may be provided in a side surface of the body 120b.

When the screw 120 rotates in the forward direction (e.g., the clockwise direction), each of the stubs 142 may not hinder a forward rotation of the screw 120. When the screw 120 rotates in a reverse direction (e.g., a counter clockwise direction), each of the stubs 142 may block a reverse rotation of the screw 120. When the screw 120 rotates in the forward direction (e.g., the clockwise direction), a first surface of the stub 142 contacting the side surface of the head 120a may be provided at a first angle. When the screw 120 rotates in the reverse direction (e.g., the counter clockwise direction), a second surface of the stub 142 contacting the side surface of the head 120a may be provided at a second angle.

For example, the first surface of the stub 142 may be provided at the first angle of about 110 degrees to about 160 degrees with respect to an inner surface of the upper casing 140 so as to enable the forward rotation of the screw 120. The second surface of the stub 142 may be provided at a perpendicular angle or an angle of about 80 degrees to about 90 degrees with respect to the inner surface of the upper casing 140 so as to block the reverse rotation of the screw 120.

For example, the first angle of the stub 142 may be provided to be inclined at an angle of about 110 degrees to about 160 degrees, and thus, the stub 142 may slide and may be inserted into the stub groove 122. The second angle of the stub 142 may be provided at a perpendicular angle or an angle of about 80 degrees to about 90 degrees, and when the screw 120 rotates in the reverse direction (e.g., the counter clockwise direction), the second surface of the stub 142 may contact a side surface of the stub groove 122. An inner surface of the stub groove 122 contacting the second surface of the stub 142 may be provided vertically extending, and thus, the stub 142 might not be separated therefrom in the reverse direction (e.g., the counter clockwise direction). Accordingly, the stub 142 inserted into the stub groove 122 may prevent the screw 120 from rotating in the reverse direction (e.g., the counter clock wise direction).

By using the screw structure 100, the lower casing 130 may be fastened to the upper casing 140, and the PCB 110 may be fixed, thereby realizing automation of an assembly process and securing reliability in the electronic device 10. Also, the stub 142 may prevent the screw 120 from being loosened by external vibrations and impacts, thereby enhancing the productivity of the electronic device 10 and reducing work loss.

Figure 8:
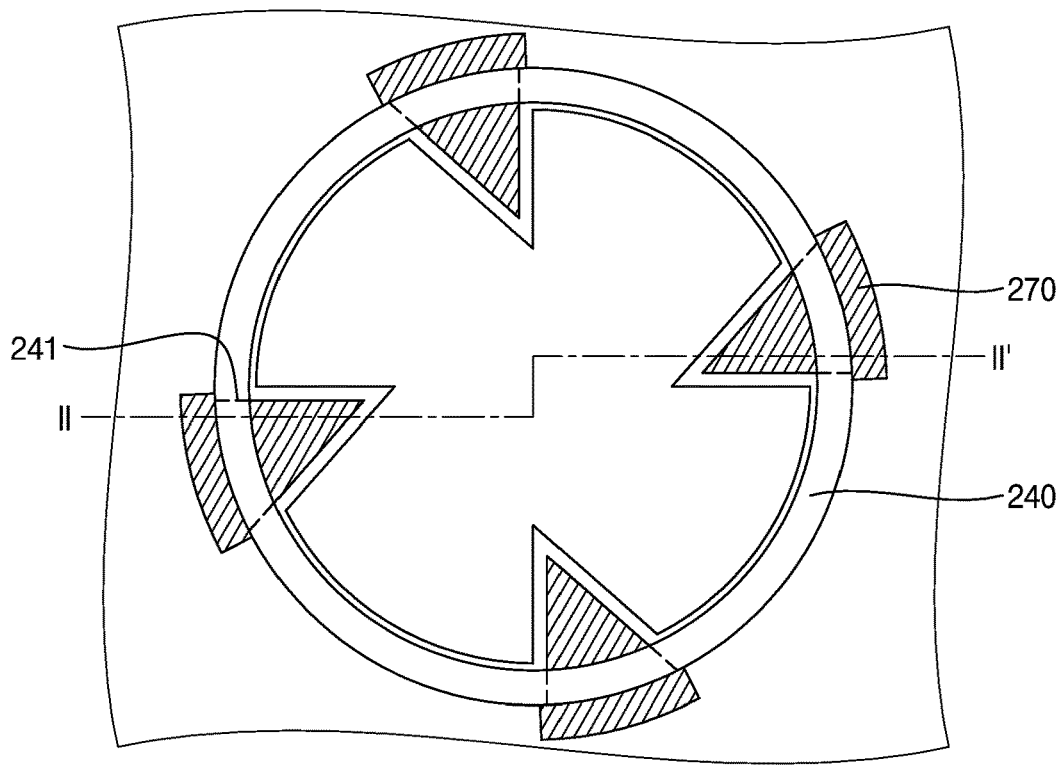
FIG. 8 is a plan view illustrating a bottom of a screw anti-loosening structure in accordance with an exemplary embodiment of the present inventive concept.
Figure 9:
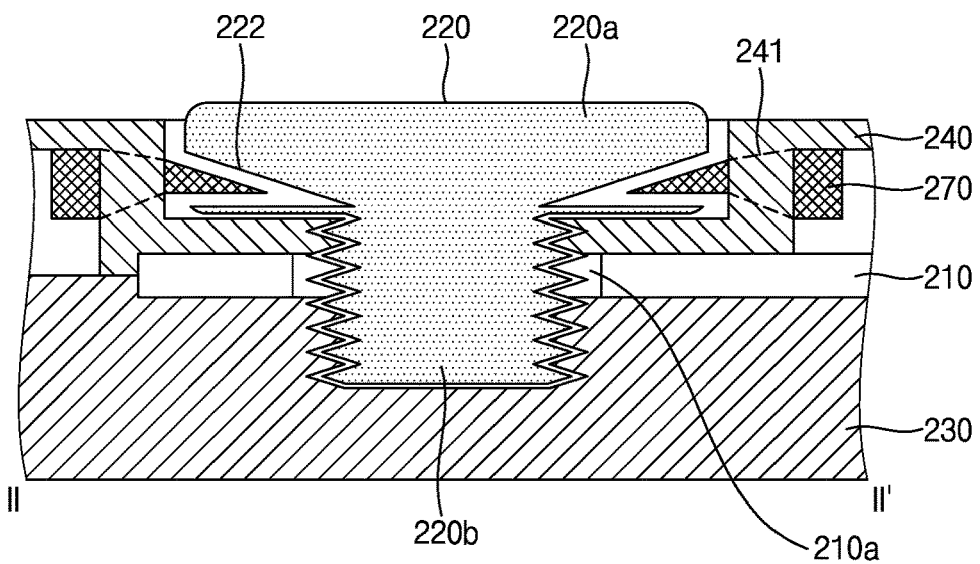
FIG. 9 is a side-view illustrating a cross-section taken along line II-II' shown in FIG. 8 in accordance with an exemplary embodiment of the present inventive concept.

FIG. 8 is a plan view illustrating a bottom of a screw anti-loosening structure 200 in accordance with an exemplary embodiment of the present inventive concept. FIG. 9 is a side-view illustrating a cross-section taken along line II-II' illustrated in FIG. 8.

Referring to FIGS. 8 and 9, the screw anti-loosening structure 200 in accordance with an exemplary embodiment of the present inventive concept may be for fastening an upper casing 240 to a lower casing 230 and may include a plurality of screws 220 and a plurality of stubs 270. Hereinafter, one screw 220 and one stub 270 will be described for example.

A PCB 210 including a plurality of semiconductor chips may be disposed between the lower casing 230 and the upper casing 240. A plurality of screw holes into which a plurality of screws 220 is inserted may be provided in the upper casing 240. A plurality of screw grooves into which the plurality of screws 220 is respectively inserted may be provided in the lower casing 230. Inner sidewalls of the plurality of screw holes and the plurality of screw grooves may be disposed to overlap one another in the vertical direction.

In order for the screws 220 to be fastened to the plurality of screw holes and the plurality of screw grooves, screw crests and screw roots may be provided in each screw hole of the upper casing 240 and each screw groove of the lower casing 230. The screws 220 may be respectively inserted into the screw grooves and the screw holes, and thus, the lower casing 230 and the upper casing 240 may be coupled. The screws 220 may be inserted in the first direction from the upper casing 240 to the lower casing 230 and may fasten the upper casing 240 to the lower casing 230.

A plurality of holes 210a into which the screws 220 are respectively inserted may be provided in an edge portion of the PCB 210, and the screws 220 may be respectively inserted into the holes 210a of the PCB 210. By using the screws 220, the lower casing 230 may be fastened to the upper casing 240, and the PCB 210 may be fixed to the inner portion between the lower casing 230 and the upper casing 240.

An inner sidewall may be formed in the holes 210a of the upper casing 240. A plurality of stub holes 241 which pass through the inner sidewall of the upper casing 240 in a horizontal direction may be provided. The plurality of stubs 270 may be respectively inserted into the plurality of stub holes 241.

Each of the stubs 270 may have a tetrahedral shape in which a front end thereof is sharp and a rear end thereof is wide. For example, the sharp front end may be disposed adjacent to the stub grooves 222. Each of the stubs 270 may protrude toward the inside of the upper casing 240. For example, each of the stubs 270 may have a protruding polyhedral shape. One screw anti-loosening structure 200 may include two to four stubs 270, but the present inventive concept is not limited thereto. For example, the screw anti-loosening structure 200 may include five to eight stubs 270.

Each of the screws 220 may include ahead 220a and a body 220b. A diameter of the head 220a of each screw 220 may be about 2.0 mm to about 5.0 mm. A plurality of stub grooves 222 into which the plurality of stubs 270 are inserted may be provided in a side surface of the head 220a of each screw 220. Each of the stub grooves 222 may be provided to include an area greater than an area of each of the stubs 270.

In a casing where each of the stubs 270 has a protruding tetrahedral shape, each of the stub grooves 222 may have a recessed tetrahedral shape (or a concave tetrahedral shape), but the present inventive concept is not limited thereto. In an exemplary embodiment of the present inventive concept, in a casing where each of the stubs 270 has a protruding polyhedral shape, each of the stub grooves 222 may have a recessed polyhedral shape (or a concave polyhedral shape) to complement a corresponding stub 270. The body 220b of the screw 220 may have a rod shape, and screw crests and screw roots may be provided in a side surface of the body 220b.

When the screw 220 rotates in the forward direction (e.g., the clockwise direction), each of the stubs 270 might not hinder a forward rotation of the screw 220, and when the screw 220 rotates in a reverse direction (e.g., the counter clockwise direction), each of the stubs 270 may block a reverse rotation of the screw 220. When the screw 220 rotates in the forward direction (e.g., the clockwise direction), a first surface of the stub 270 contacting the side surface of the head 220a may be provided at a first angle. When the screw 220 rotates in the reverse direction (e.g., the counter clockwise direction), a second surface of the stub 270 contacting the head 220*a* may be provided at a second angle.

For example, the first angle of the stub 270 may be provided at an angle of about 110 degrees to about 160 degrees with respect to an inner surface of the upper casing 240 so as to enable the forward rotation of the screw 220. The second angle of the stub 270 may be provided at a perpendicular angle or an angle of about 80 degrees to about 90 degrees with respect to the inner surface of the upper casing 240 so as to block the reverse rotation of the screw 220.

The first angle of the stub 270 may be provided to be inclined at an angle of about 110 degrees to about 160 degrees, and thus, the stub 270 may slide and may be inserted into the stub groove 222. The second angle of the stub 270 may be provided at a perpendicular angle or an angle of about 80 degrees to about 90 degrees, and when the screw 220 rotates in the reverse direction (e.g., the counter clockwise direction), the second surface of the stub 270 may contact a side surface (e.g., an upper surface of the lower portion) of the stub groove 222. An inner surface of the stub groove 222 contacting the second surface of the stub 270 may horizontally and vertically extend and may overlap the second surface of the stub 270. Thus, the stub 270 might not be separated therefrom in the reverse direction (e.g., the counter clockwise direction). Accordingly, the stub 270 inserted into the stub groove 222 may prevent the screw 220 from rotating in the reverse direction (e.g., the counter clockwise direction).

By using the screw structure 200, the lower casing 230 may be fastened to the upper casing 240, and the PCB 210 may be fixed, thereby realizing automation of an assembly process and securing reliability in an electronic device. Also, the stub 270 may prevent the screw 220 from being loosened by external vibrations and impacts, thereby enhancing the productivity of the electronic device and reducing work loss.

Figure 10:
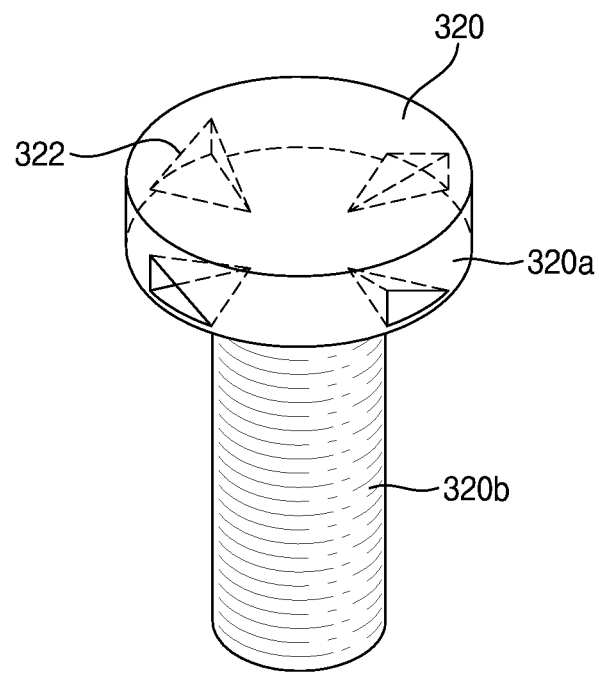
FIG. 10 is an exploded perspective view illustrating a screw anti-loosening structure including a stub in accordance with an exemplary embodiment of the present inventive concept.
Figure 10:
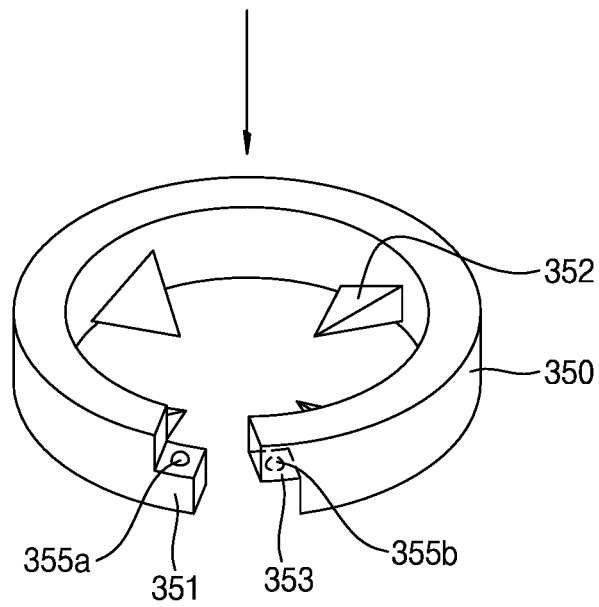
Figure 11:
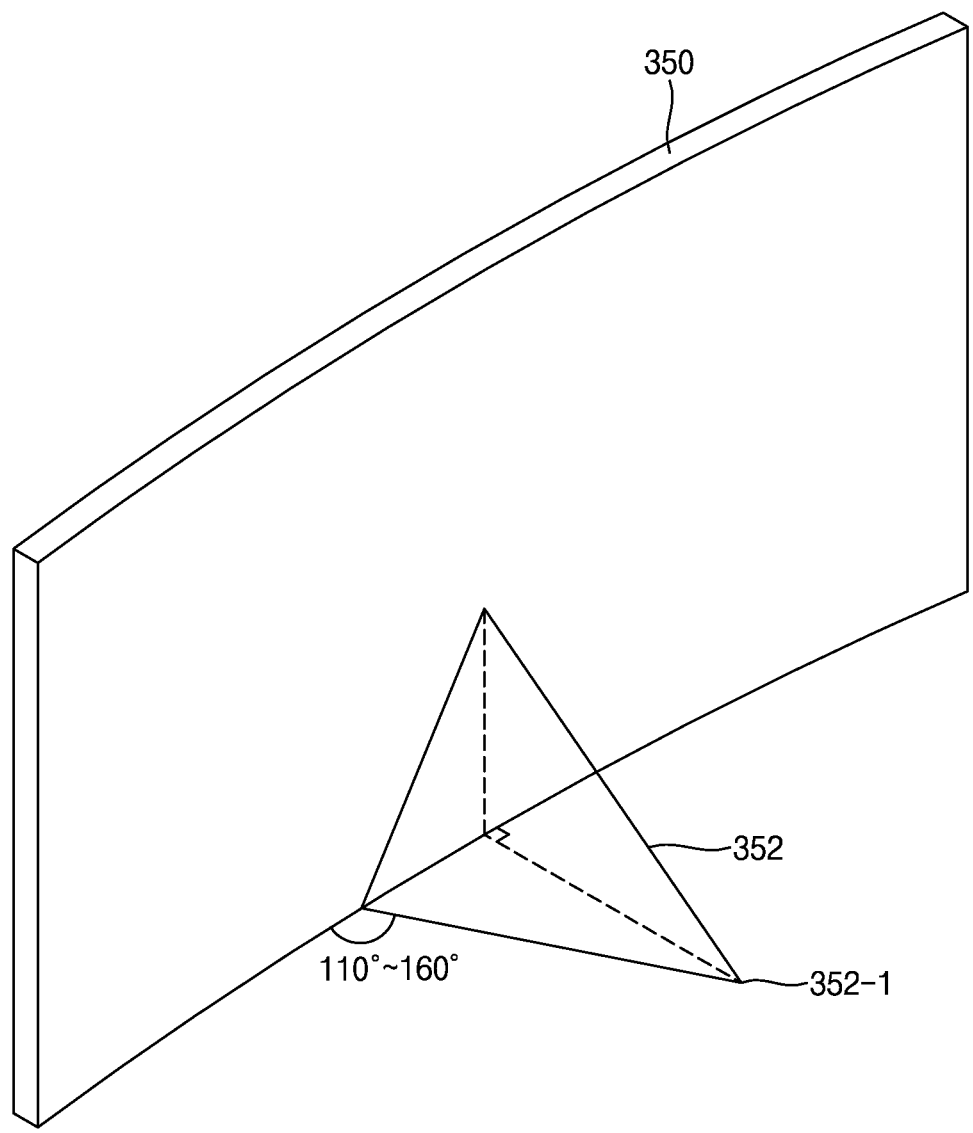
FIG. 11 is a partial perspective view illustrating an example of the stub in accordance with an exemplary embodiment of the present inventive concept.

FIG. 10 is an exploded perspective view illustrating a cross-section of a screw anti-loosening structure 300 including a stub 352 in accordance with an exemplary embodiment of the present inventive concept. FIG. 11 illustrates an example of the stub 352 in accordance with an exemplary embodiment of the present inventive concept.

Referring to FIGS. 10 and 11, the screw anti-loosening structure 300 in accordance with an exemplary embodiment of the present inventive concept may include a screw 320 and a stub tie 350. The stub tie 350 may include a plurality of stubs 352 protruding from an inner surface thereof.

The stub tie 350 may be provided in a long annular band shape, and the stub tie 350 may be circularly rolled and may be inserted into a hole of an upper casing. In order for the stub tie 350 to be fixed to an inner portion of the hole of the upper casing, an adhesive may be applied to the inner portion of the hole of the upper casing. Accordingly, an adhesive layer may be provided between the hole of the upper casing and the stub tie 350.

In order for the stub tie 350 to maintain a circular shape, a first end 351 and a second end 353 of the stub tie 350 may be fastened to each other. The first end 351 may be provided to be a staircase shape by removing an upper portion thereof. The second end 353 may be provided to be a staircase shape by removing a lower portion thereof. A coupling projection (e.g., embossed projection) 355*a* may be provided in an upper surface of the first end 351, and a coupling groove (e.g., a pit) 355*b* may be provided in a lower surface of the second end 353. The coupling projection 355*a* of the first end 351 may be inserted into the coupling groove 355*b* of the second end 353, and thus, the first end 351 may be coupled to the second end 353. In an exemplary embodiment of the present inventive concept, the coupling projection (e.g., embossed projection) may be provided in the lower surface of the second end 351, and the coupling groove (e.g., the pit) may be provided in the upper surface of the first end 353.

In a state where the stub tie 350 is inserted into a groove of the upper casing, the upper casing may be fastened to a lower casing by rotating the screw 320 inserted thereinto in the forward direction (e.g., the clockwise direction).

Each of the stubs 352 may have a tetrahedral shape where a front end 352-1 thereof is sharp and a rear end thereof is wide, but the present inventive concept is not limited thereto and may have a protruding polyhedral shape. One screw anti-loosening structure 300 may include two to four stubs 352, but is not limited thereto and may include, for example, five to eight stubs 352.

Each of the screws 320 may include a head 320*a* and a body 320*b*. A diameter of the head 320*a* of each screw 320 may be about 2.0 mm to about 5.0 mm. A plurality of stub grooves 322 into which the plurality of stubs 352 are inserted may be provided in a side surface of the head 320*a* of each screw 320. Each of the stub grooves 322 may be greater than each of the stubs 352.

In a casing where each of the stubs 352 has a protruding tetrahedral shape, each of the stub grooves 322 may have a recessed tetrahedral shape (or a concave tetrahedral shape), but the present inventive concept is not limited thereto. In an exemplary embodiment of the present inventive concept, in a casing where each of the stubs 352 has a protruding polyhedral shape, each of the stub grooves 322 may have a recessed polyhedral shape (or a concave polyhedral shape) to complement a corresponding stub 352. The body 320*b* of the screw 320 may have a rod shape, and screw crests and screw roots may be provided in a side surface of the body 320*b*.

When the screw 320 rotates in the forward direction (e.g., the clockwise direction), each of the stubs 352 might not hinder a forward rotation of the screw 320, and when the screw 320 rotates in the reverse direction (e.g., the counter clockwise direction), each of the stubs 352 may block a reverse rotation of the screw 320. When the screw 320 rotates in the forward direction (e.g., the clockwise direction), a first surface of the stub 352 contacting the head 320*a* may be provided at a first angle. When the screw 320 rotates in the reverse direction (e.g., the counter clockwise direction), a second surface of the stub 352 contacting the head 320*a* may be provided at a second angle.

For example, the first surface of the stub 352 may be provided at an angle of about 110 degrees to about 160 degrees with respect to an inner surface thereof so as to enable the forward rotation of the screw 320. The second surface of the stub 352 may be provided at a perpendicular angle or an angle of about 80 degrees to about 90 degrees with respect to the inner surface so as to block the reverse rotation of the screw 320.

The first surface of the stub 352 may be provided to be inclined at an angle of about 110 degrees to about 160 degrees, and thus, the stub 352 may slide and may be inserted into the stub groove 322. The second surface of the stub 352 may be provided at a perpendicular angle or an angle of about 80 degrees to about 90 degrees, and when the screw 320 rotates in the reverse direction (e.g., the counter clockwise direction), the second surface of the stub 352 may contact a side surface of the stub groove 322. An inner surface of the stub groove 322 (e.g., the upper surface of the lower portion) contacting the second surface of the stub 352 may overlap the second surface of the stub 352 and may be vertically extended, and thus, the stub 352 may not be separated therefrom by blocking rotation in the reverse direction (e.g., the counter clockwise direction). Accordingly, the stub 352 inserted into the stub groove 322 may prevent the screw 320 from rotating in the reverse direction (e.g., the counter clockwise direction).

Figure 12:
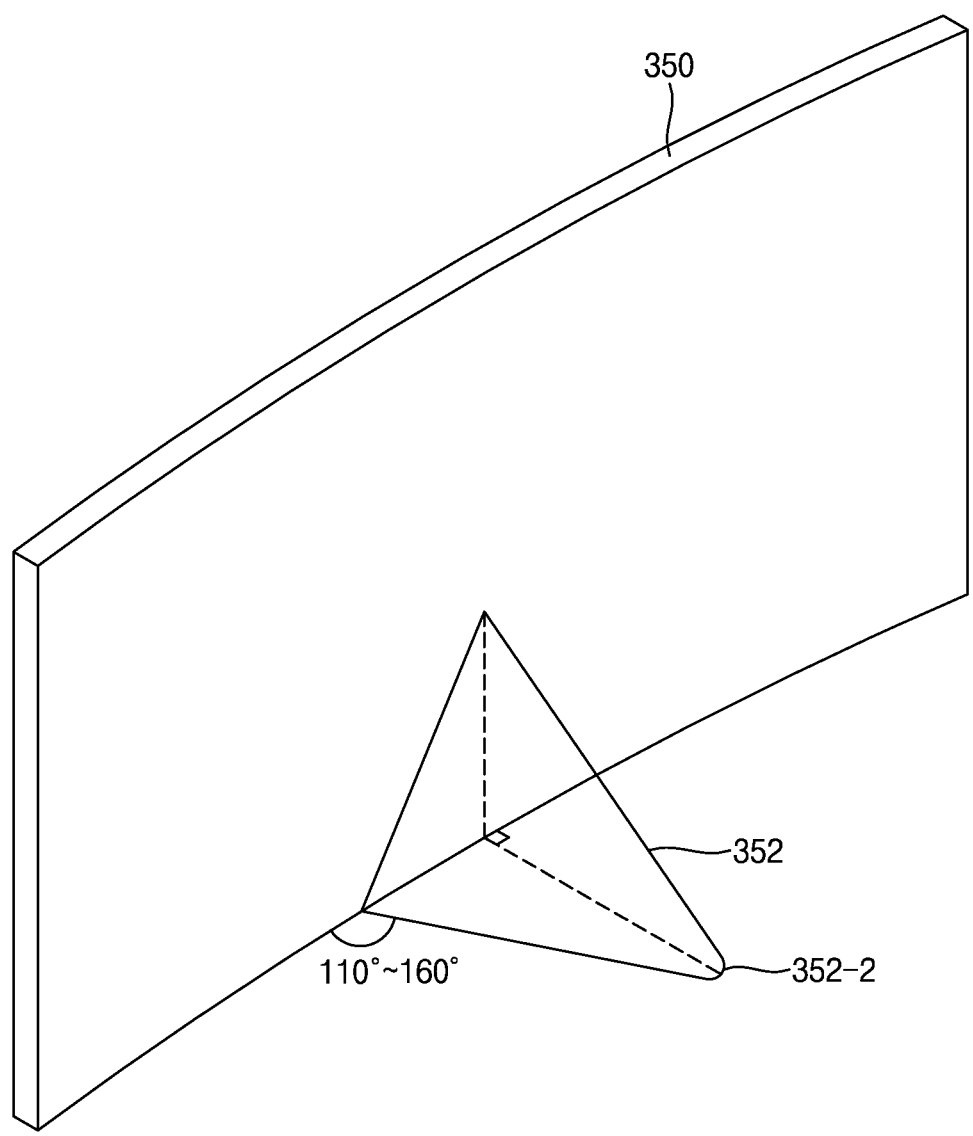
FIG. 12 is a partial perspective view illustrating an example of a stub in accordance with an exemplary embodiment of the present inventive concept.

FIG. 12 illustrates an example of a stub 352 in accordance with an exemplary embodiment of the present inventive concept.

Figure 13:
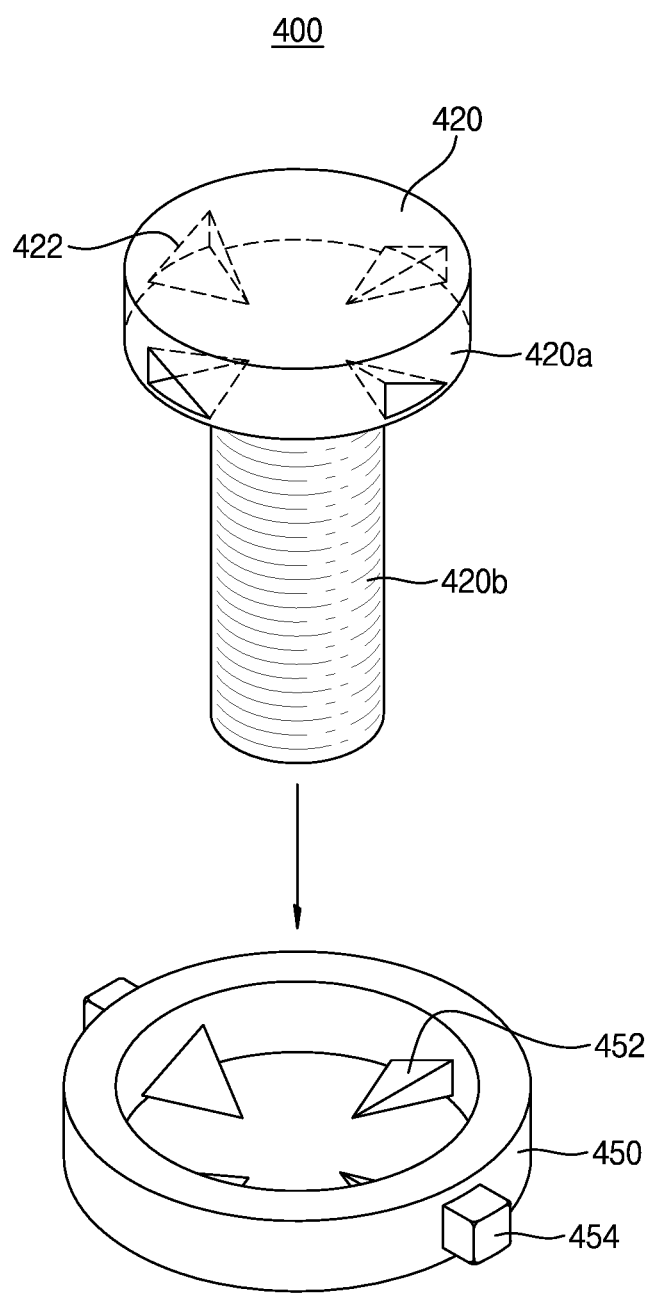
FIG. 13 illustrates an exploded perspective view of a screw anti-loosening structure including a stub in accordance with an exemplary embodiment of the present inventive concept.
Figure 14:
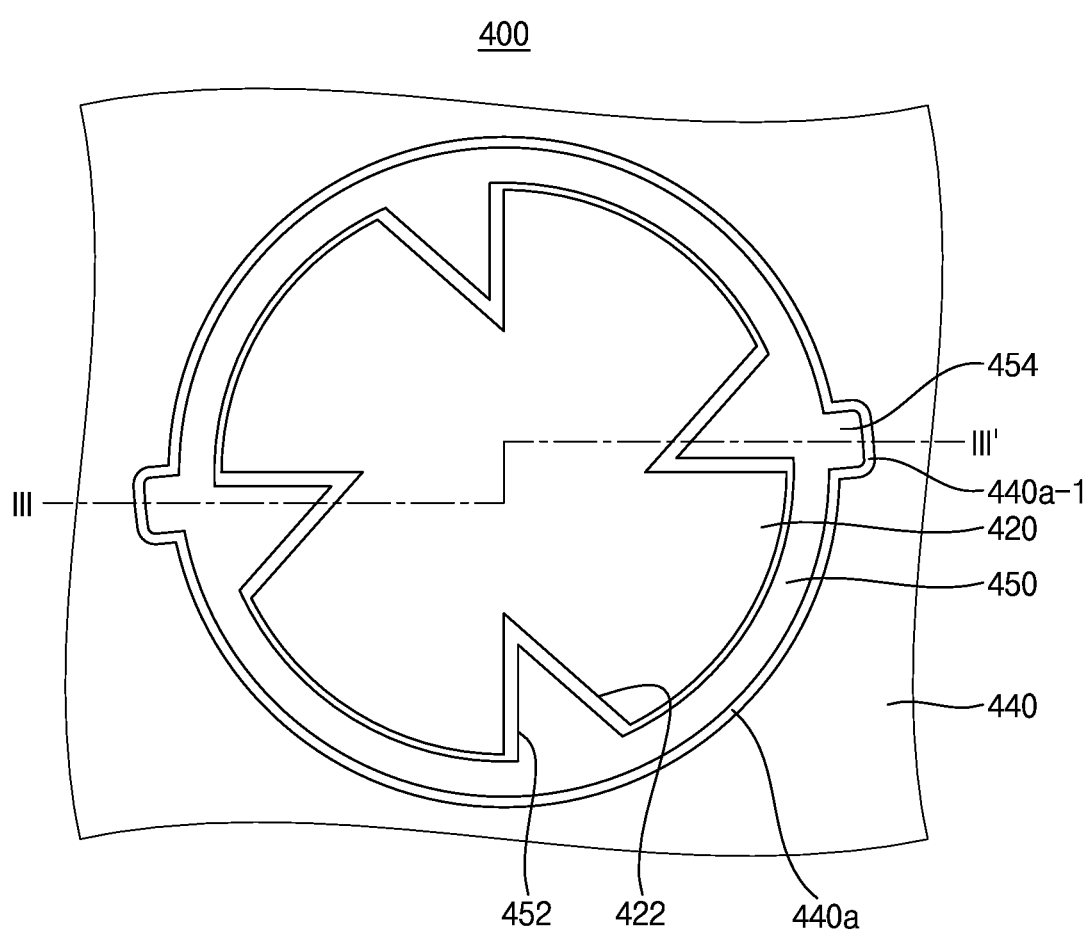
FIG. 14 is a plan view illustrating a bottom of a screw 420 being fastened to the stub in a second direction.
Figure 15:
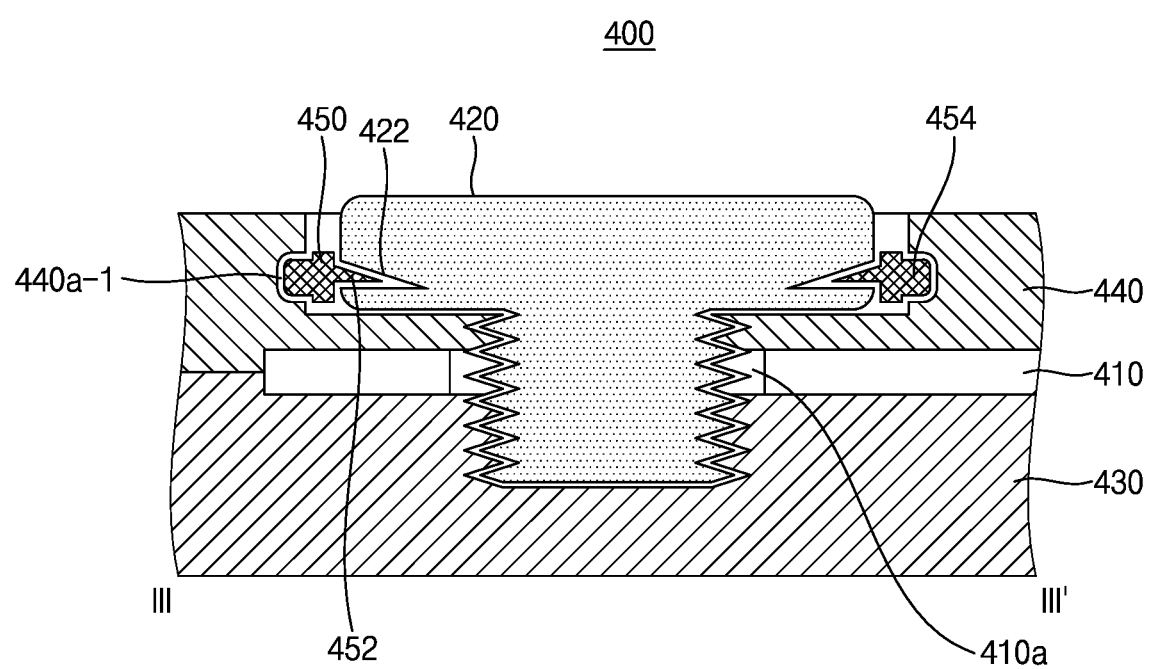
FIG. 15 is a side-view illustrating a cross-section taken along line III-III' shown in FIG. 14.

Referring to FIGS. 10 and 12, a front end 352-2 of a stub 352 may be provided to have a predetermined curvature so that a forward rotation of the screw 320 is smoothly performed. For example, the front end 352-2 of the stub 352 may be provided in a round shape to have a diameter of about 0.11 mm to about 0.12 mm. Since the front end 352-2 of the stub 352 has a round shape, friction between the stub 352 and the screw 320 may be reduced, and thus, the forward rotation of the screw 320 may be smoothly performed. For example, the stub 352 may have a rounded end portion (e.g., a tip). FIG. 13 is an exploded perspective view illustrating a screw anti-loosening structure 400 including a stub 452 in accordance with an exemplary embodiment of the present inventive concept. FIG. 14 is a bottom view of a screw 420 being fastened to the stub 452 in a second direction. FIG. 15 is a side-view illustrating a cross-section taken along line III-III' shown in FIG. 14.

Referring to FIGS. 13 to 15, the screw anti-loosening structure 400 in accordance with an exemplary embodiment of the present inventive concept may be for fastening an upper casing 440 to a lower casing 430 and may include a screw 420 and a stub tie 450.

A PCB 410 including a plurality of semiconductor chips may be mounted on an inner portion between the lower casing 430 and the upper casing 440. A plurality of screw holes 440a into which a plurality of screws 420 are inserted may be provided in the upper casing 440. A plurality of screw grooves into which the plurality of screws 420 is respectively inserted may be provided in the lower casing 430. Sidewalls of the plurality of screw holes 440a and the plurality of screw grooves may be disposed to overlap one another in the vertical direction.

In order for the screws 420 to be fastened to the plurality of screw holes 440a and the plurality of screw grooves, screw crests and screw roots may be provided in each screw hole 440a of the upper casing 440 and each screw groove of the lower casing 430. The screws 420 may be inserted into the screw grooves and the screw holes 440a, and thus, the lower casing 430 and the upper casing 440 may be coupled. The screws 420 may be inserted in the first direction from the upper casing 440 to the lower casing 430 and may fasten the upper casing 440 to the lower casing 430.

The stub tie 450 may include a plurality of stubs 452 protruding from an inner surface thereof. The stub tie 450 may be provided in a circular shape and may be inserted into the screw hole 440a of the upper casing 440. In order for the stub tie 450 to be fixed to an inner portion of the screw hole 440a of the upper casing 440, a plurality of fixing projections 454 may be provided in an outer surface of the stub tie 450. A plurality of projection grooves 440a-1 into which the plurality of fixing projections 454 is inserted may be provided in the upper casing 440.

The screw holes 440a of the upper casing 440 may be provided to pass through the upper casing 440 in the vertical direction. The projection grooves 440a-1 of the upper casing 440 may be provided to each have a predetermined depth, and the fixing projections of the stub tie 450 may be inserted into the projection grooves 440a-1. As described above, the plurality of fixing projections 454 may be provided in the outer surface of the stub tie 450 and may be inserted into the projection grooves 440a-1 of the upper casing 440 to fix the stub tie 450.

A plurality of holes 410a into which the screws 420 are inserted may be provided in an edge portion of the PCB 410, and the screws 420 may be inserted into the screw holes 410a of the PCB 410. By using the screws 420, the lower casing 430 may be fastened to the upper casing 440, and the PCB 410 may be fixed to the inner portion between the lower casing 430 and the upper casing 440.

Each of the stubs 452 may have a tetrahedral shape where a front end thereof is sharp and a rear end thereof is relatively wider. For example, a front end of the tetrahedral shape may come to a point whereas a rear end does not. Each of the stubs 452 may protrude from an inner surface of the stub tie 450.

The present exemplary embodiment of the present inventive concept is not limited thereto, and each of the stubs 452 may have a protruding polyhedral shape. One screw anti-loosening structure 400 may include two to four stubs 452, but the present inventive concept is not limited thereto. For example, the anti-loosening structure 400 may include five to eight stubs 452.

Each of the screws 420 may include a head 420a and a body 420b. A diameter of the head 420a of each screw 420 may be about 2.0 mm to about 5.0 mm. A plurality of stub grooves 422 into which the plurality of stubs 452 are inserted may be provided in a side surface of the head 420a of each screw 420. Each of the stub grooves 422 may be provided to be greater than each of the stubs 452.

In a casing where each of the stubs 452 has a protruding tetrahedral shape, each of the stub grooves 422 may have a recessed tetrahedral shape (or a concave tetrahedral shape), but the present inventive concept is not limited thereto. In an exemplary embodiment of the present inventive concept, in a casing where each of the stubs 452 has a protruding polyhedral shape, each of the stub grooves 422 may have a recessed polyhedral shape (or a concave polyhedral shape) to complement a corresponding stub 452. The body 420b of the screw 420 may have a rod shape, and screw crests and screw roots may be provided at a side surface of the body 420b.

When the screw 420 rotates in the forward direction (e.g., the clockwise direction), each of the stubs 452 might not hinder a forward rotation of the screw 420, and when the screw 420 rotates in a reverse direction (e.g., the counter clockwise direction), each of the stubs 452 may block a reverse rotation of the screw 420. When the screw 420 rotates in the forward direction (e.g., the clockwise direction), a first surface of the stub 452 contacting the head 420a may be provided at a first angle. When the screw 420 rotates in the reverse direction (e.g., the counter clockwise direction), a second surface of the stub 452 contacting the head 420a may be provided at a second angle.

For example, the first surface of the stub 420 may be provided at an angle of about 110 degrees to about 160 degrees with respect to an inner surface so as to enable the forward rotation of the screw 420. The second surface of the stub 452 may be provided at a perpendicular angle or an angle of about 80 degrees to about 90 degrees with respect to the inner surface so as to block the reverse rotation of the screw 420.

According to an exemplary embodiment of the present inventive concept, a complementary notch may be formed at the lower surface of the lower portion of the stub groove 422 overlapping the first surface of the stub 420 to permit clearance during a forward rotation. However, the position of the notch may be displaced after additional forward rotation following clearance such that it no longer aligns with the clearance position.

The first surface of the stub 452 may be provided to be inclined at an angle of about 110 degrees to about 160 degrees, and thus, the stub 452 may slide and may be inserted into the stub groove 422. The second surface of the stub 452 may be provided at a perpendicular angle or an angle of about 80 degrees to about 90 degrees, and thus, when the screw 420 rotates in the reverse direction (e.g., the counter clockwise direction), the second surface of the stub 452 may contact a side surface of the stub groove 422. An inner surface of the stub groove 422 contacting the second surface of the stub 452 may be provided vertically extending, and thus, the stub 452 may not be separated therefrom in the reverse direction (e.g., the counter clockwise direction). For example, the second surface of the stub 452 may be parallel to an inner surface of the stub groove 422 and overlap therewith in the vertical direction. Accordingly, the stub 452 inserted into the stub groove 422 may prevent the screw 420 from rotating in the reverse direction (e.g., the counter clockwise direction).

By using the screw structure 400, the lower casing 430 may be fastened to the upper casing 440, and the PCB 410 may be fixed. Accordingly, automation of an assembly process may be realized and reliability may be secured in an electronic device. Also, the stub 452 may prevent the screw 420 from being loosened by external vibrations and impacts, thereby enhancing the productivity of the electronic device and reducing work loss.

According to the exemplary embodiments of the present inventive concept described heretofore, a screw anti-loosening structure may prevent an upper casing and a lower casing from being detached from each other due to screw loosening.

While the present inventive concept has been particularly shown and described with reference to exemplary embodiments thereof, it will be understood that various changes in form and details may be made therein without departing from the spirit and scope of the present inventive concept.

What is claimed is:

1. A screw anti-loosening structure, comprising:
   a screw disposed within a screw hole, the screw hole disposed within a first casing;
   a screw groove disposed within a second casing; and
   at least one stub protruding toward the screw hole of the first casing,
   wherein the screw anti-loosening structure further comprises at least one stub groove disposed within a side surface of a head of the screw,
   wherein the at least one stub is disposed within the stub groove,
   wherein the at least one stub is disposed between an upper portion of the head of the screw and a lower portion of the head of the screw, and
   wherein the at least one stub overlaps the upper portion of the head of the screw and the lower portion of the head of the screw.

2. The screw anti-loosening structure of claim 1, wherein the at least one stub protrudes from an inner sidewall of the first casing.

3. The screw anti-loosening structure of claim 1, further comprising at least one stub hole penetrating through an inner sidewall of the first casing in a horizontal direction, wherein the stub passes the stub hole.

4. The screw anti-loosening structure of claim 1, wherein the at least one stub has a polyhedral shape, wherein a front end of the polyhedral shape comes to a point and a rear end of the polyhedral shape does not come to a point.

5. The screw anti-loosening structure of claim 4, wherein the at least one stub groove has a concave polyhedral shape corresponding to a shape of the at least one stub.

6. The screw anti-loosening structure of claim 4, wherein the front end of the at least one stub has a round shape, the round shape having a diameter of about 0.11 mm to about 0.12 mm.

7. The screw anti-loosening structure of claim 1,
   wherein the at least one stub comprises a first surface and a second surface,
   wherein the first surface contacts the head of the screw when the screw rotates in a forward direction,
   wherein the second surface contacts the head of the screw when the screw rotates in a reverse direction, and
   wherein the first surface of the at least one stub is provided at an angle of about 110 degrees to about 160 degrees with respect to an inner surface of the first casing, and the second surface of the at least one stub is provided at an angle of about 80 degrees to about 90 degrees with respect to the inner surface of the first casing.

8. The screw anti-loosening structure of claim 7, wherein an inner surface of the at least one stub groove that contacts the second surface of the at least one stub is provided vertically extending.

9. A screw anti-loosening structure, comprising:
   a screw disposed within a screw hole, the screw hole disposed within a first casing;
   a screw groove disposed within a second casing; and
   a stub tie disposed within the screw hole, the stub tie including a plurality of stubs protruding toward the screw hole,
   wherein the screw anti-loosening structure further comprises a plurality of stub grooves disposed within a side surface of a head of the screw,
   wherein the plurality of stubs is disposed within the plurality of stub grooves, and
   wherein the screw anti-loosening structure further comprising at least one stub hole penetrating through an inner sidewall of the first casing in a horizontal direction, wherein the plurality of stubs passes the stub hole.

10. The screw anti-loosening structure of claim 9, wherein the stub tie has a circular shape.

11. The screw anti-loosening structure of claim 10, wherein the plurality of stubs protrude from an inner sidewall of the stub tie.

12. The screw anti-loosening structure of claim 9, further comprising an adhesive layer attaching the stub tie on the screw hole.

13. The screw anti-loosening structure of claim 9, further comprising a plurality of fixing projections protruding from an outer surface of the stub tie.

14. The screw anti-loosening, structure of claim 13, wherein the first casing further comprises a plurality of projection grooves into which the plurality of fixing projections is inserted.

15. The screw anti-loosening structure of claim 9, wherein each of the plurality of stubs has a polyhedral shape, the polyhedral shape has a front end that comes to a point and a rear end that does not come to a point.

16. The screw anti-loosening structure of claim 15, wherein each of the plurality of stub grooves has a concave polyhedral shape corresponding to a shape of each of the plurality of stubs.

17. The screw anti-loosening structure of claim 15, wherein the front end of each of the plurality of stubs has a round shape, the round shape having a diameter of about 0.11 mm to about 0.12 mm.

18. The screw anti-loosening structure of claim 9, wherein each of the plurality of stubs comprises a first surface, contacting the side surface of the head of the screw when the screw rotates in a forward direction, and a second surface contacting the side surface of the head of the screw when the screw rotates in a reverse direction, and wherein the first surface of each of the plurality of stubs is provided at an angle of about 110 degrees to about 160 degrees with respect to an inner surface of the first casing, and the second surface of each of the plurality of stubs is provided an angle of about 80 degrees to about 90 degrees with respect to the inner surface of the first casing.

19. The screw anti-loosening structure of claim 18, wherein inner surfaces of the plurality of stub grooves contacting the second surfaces of the plurality of stubs are provided vertically extending.

20. An electronic device including a screw anti-loosening structure for fastening casings, the electronic device comprising:

a first casing and a second casing, a space being provided between the first casing and the second casing;

the screw anti-loosening structure for fastening the first casing to the second casing; and a printed circuit board including a plurality of semiconductor chips disposed in the space provided between the first casing and the second casing, wherein the screw anti-loosening structure comprises:

a screw disposed within a screw hole, the screw hole is disposed within the first casing;

a screw groove disposed within the second easing;

a plurality of stubs protruding toward the screw hole of the first casing; and a plurality of stub grooves disposed within a side surface of a head of the screw, wherein the plurality of stubs is disposed within the plurality of stub grooves, wherein the plurality of stubs protrudes from an inner sidewall of the first casing, and wherein the plurality of stub grooves defining ridges that extend perpendicularly with respect to a central axis of the screw, disposed between the plurality of stub grooves and a bottom surface of the first casing that contacts the second casing.

* * * * *